(12) United States Patent
Scarlett et al.

(10) Patent No.: US 6,204,711 B1
(45) Date of Patent: Mar. 20, 2001

(54) REDUCED ERROR ASYNCHRONOUS CLOCK

(75) Inventors: James Edward Scarlett, Hartland; David Leo McDaniel, Dousman, both of WI (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/414,149

(22) Filed: Oct. 7, 1999

(51) Int. Cl.$^7$ .................................................. G06F 1/04
(52) U.S. Cl. ..................... 327/291; 327/160; 327/295; 327/271; 327/278
(58) Field of Search ............................ 327/291, 271, 327/269, 284, 295, 299, 158, 159, 160, 161, 270, 272, 276, 278, 175

(56) References Cited

U.S. PATENT DOCUMENTS 5,740,410 * 4/1998 McDermott ........................ 713/501

\* cited by examiner

*Primary Examiner*—Kenneth B. Wells
*Assistant Examiner*—Cassandra Cox

(74) *Attorney, Agent, or Firm*—Christian G. Cabou

(57) ABSTRACT

A cascaded delay asynchronous clock (CDAC) for operating control logic (16) to process an event signal. The clock includes a flip-flop (15) for receiving the event signal and generating a clock enable signal and a logic gate (14) connected to the flip-flop (15) for receiving the clock enable signal and generating a clock signal. The clock signal is then communicated to the control logic (16) for use in the control process. The CDAC further includes a plurality of cascaded delays (10) connected in series, such that the first cascaded delay (10) is connected to receive as an input the clock signal, and the last delay (10) is further connected to the logic gate (14). The output of each of the plurality of cascaded delays (10) is fed back to the control logic (16) to generate timing signals. In another aspect of the invention, a variable duty cycle asynchronous clock (VDAC) for operating control logic (40) to process an event signal is disclosed. The clock includes a first flip-flop (32) for receiving the event signal and generating a clock enable signal, decode logic unit (41) adapted to receive the clock enable signal and generate a control signal, and a second flip-flop (34) adapted to receive the control signal and generate a clock signal. The clock signal is communicated to the control logic (40) for use as a timing signal. The VDAC further includes first and second series connected delays (36, 38), wherein the output of each of the delays is fed back to the decode logic unit (41) and control logic (40) to generate timing signals.

20 Claims, 3 Drawing Sheets

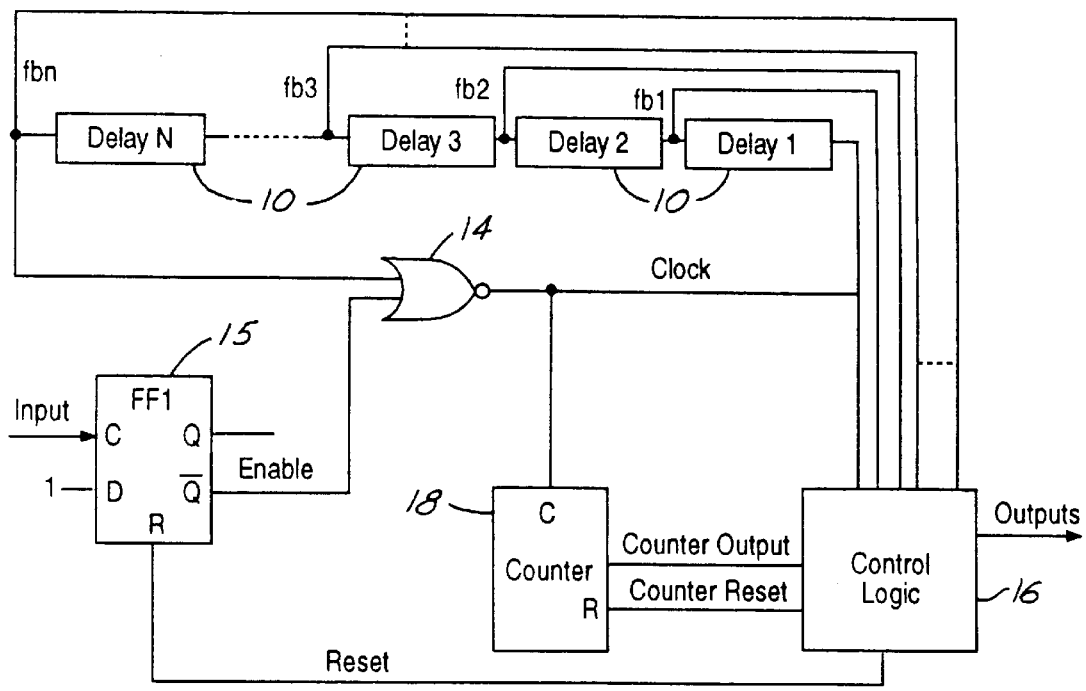
FIG.1
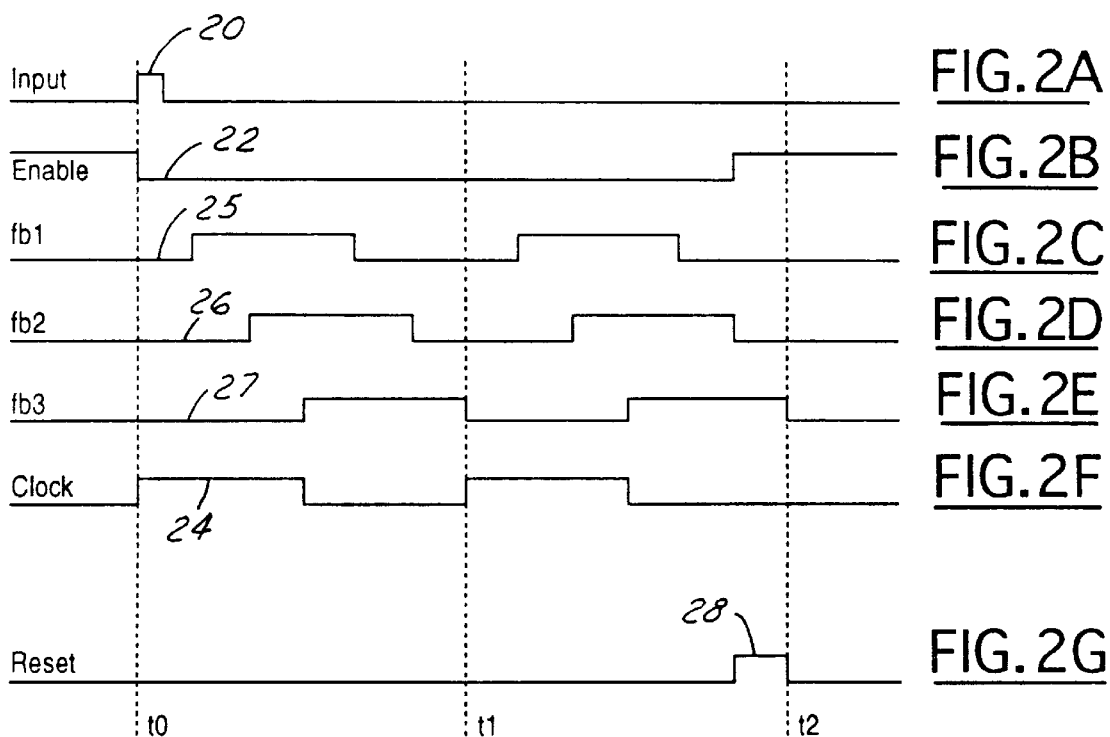
FIG.2A
FIG.2B
FIG.2C
FIG.2D
FIG.2E
FIG.2F
FIG.2G

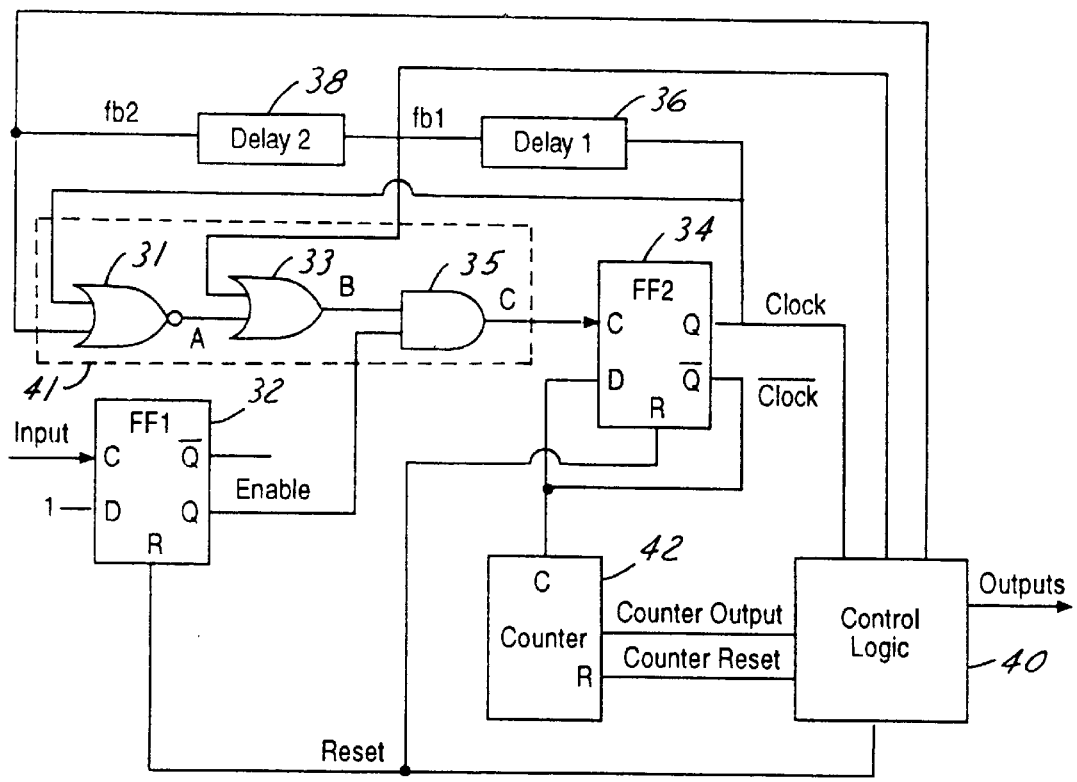
FIG.3
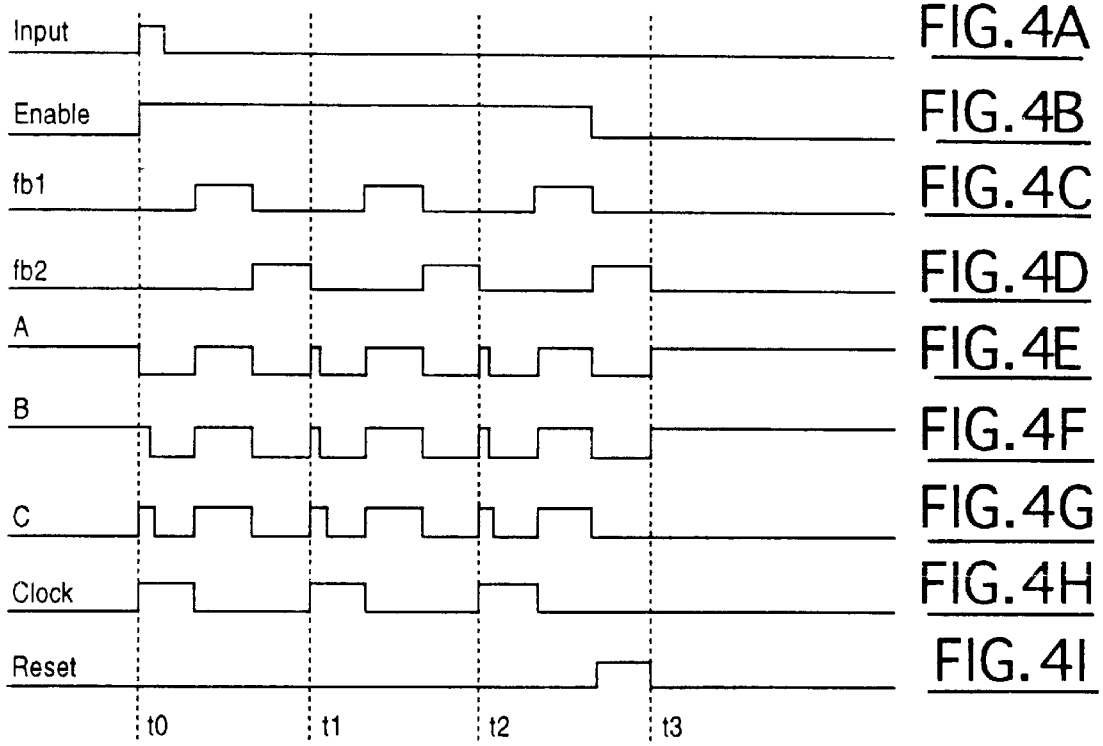

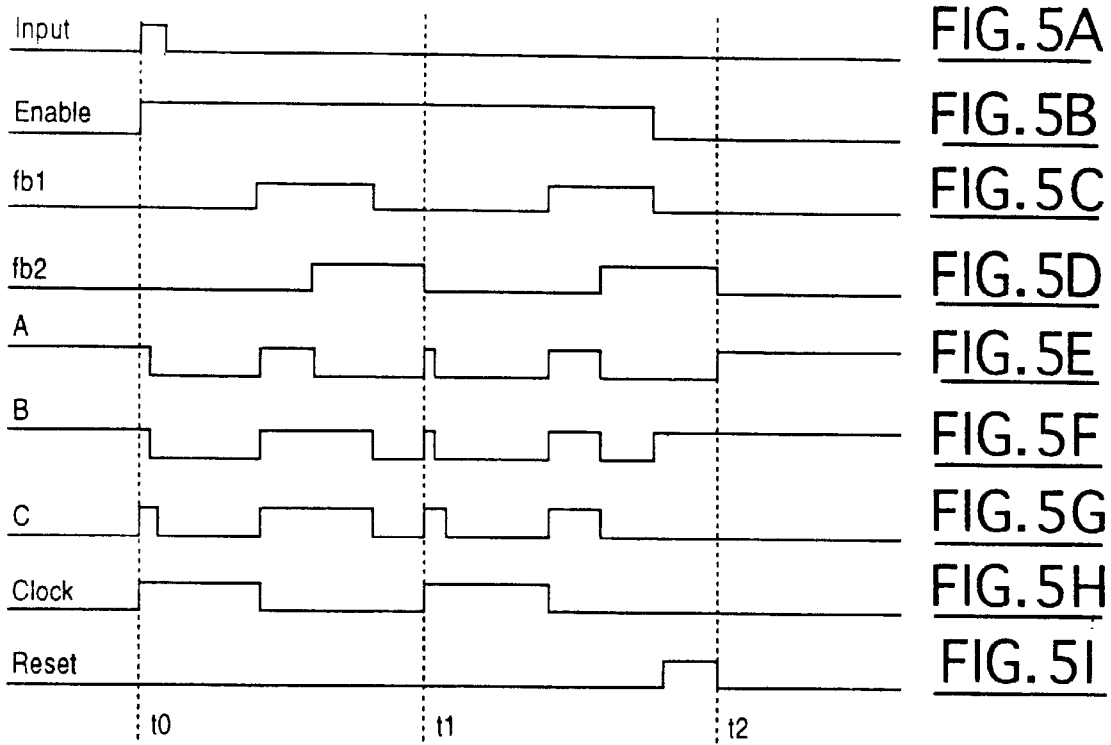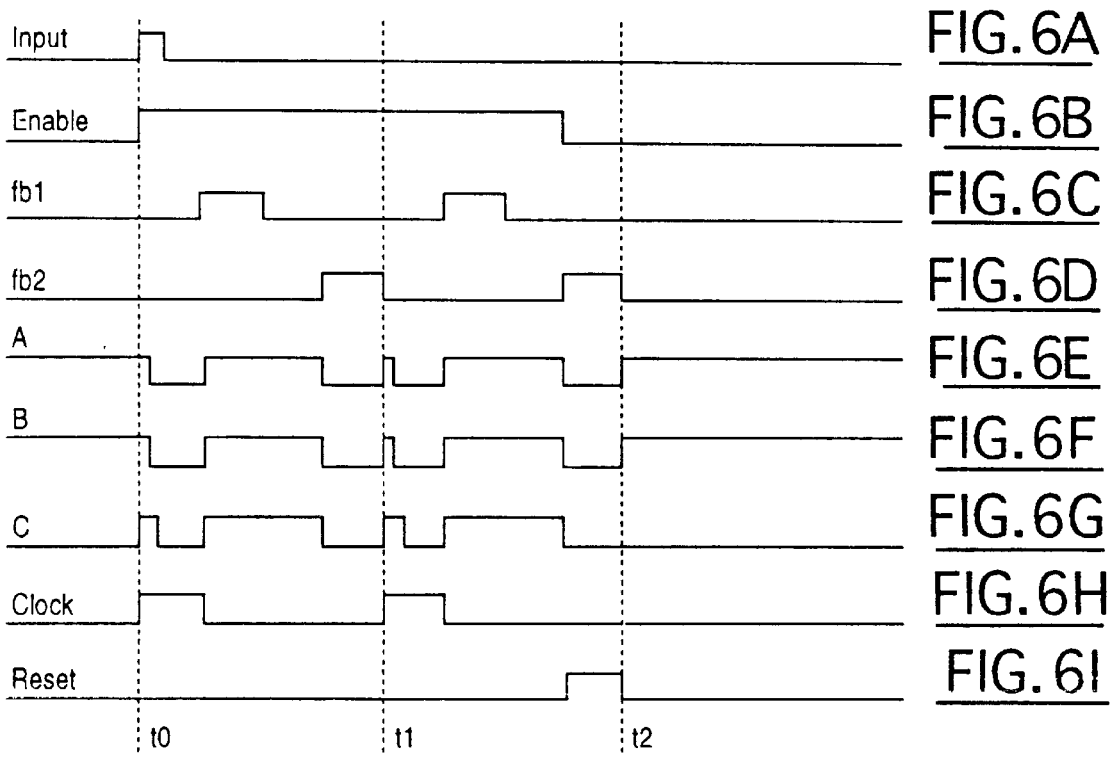

REDUCED ERROR ASYNCHRONOUS CLOCK

BACKGROUND OF THE INVENTION

The present invention relates to electronic timers and, more particularly, to an improved asynchronous clock for processing signals from random events.

BACKGROUND ART

In many electronic applications, it is necessary to process signals from random events. For example, signals generated by gamma rays in medical imaging equipment are random events. To produce images or data from such events, several process steps must occur at specific time intervals after an event detection. Typically, this consists of several sequential steps whose timing (start and duration) must be precisely controlled. The timing of the control signals for the processing hardware is typically derived from the start of the event signal.

In the current art, these control signals are typically generated using cascaded delays, multi-tap delays, or a multivibrator with a constant period. Each of these methods are described below, with reference to an integrator. An integrator requires a control signal to begin integration, and another control signal to reset. An integration step is a common step in the processing of medical images. Of course, many other signals may be necessary but, for the sake of brevity, will not be used in this discussion. In addition, the timing of each control signal depends on the individual application as well.

In the case where the control signals are generated with a series of cascaded delays, (typically digital delay lines) an input pulse representing the start of the event signal is communicated to a delay, and starts the integration. The output of the delay stops the integration, initiates the measurement of the integrated value, and is communicated to a second delay. The output of the second delay starts the reset of the integrator, and is also communicated to a third delay. The output of the third delay terminates the reset of the integrator, and so on.

The cascaded delay line method of generating control signals has several limitations. First, each control signal requires its own delay line. Therefore, systems requiring many signals must have many delay lines. This increases the system cost and power consumption. Second, in general, it is desirable to implement control logic using programmable devices such as PLDs. Cascaded delay lines, however, require a large number of I/O connections to the PLD for the delays. The large number of connections requires the use of larger PLDs (more pins) than necessary. Third, the increased number of devices and connections reduces the reliability of the circuit.

In the case where the control signals are generated with a multi-tap delay, the device has a fixed total delay, with a series of outputs providing access to the signal at equal timing intervals as it propagates through the total delay. An input pulse representing the start of the event signal is fed into the delay, and starts the integration. When the signal appears on a selected tap, the integration is stopped and the measurement of the integrated value is initiated. When the signal appears on a second selected tap, the reset of the integrator commences. The reset is terminated when the signal appears on a third selected tap and so on.

The multi-tap delay line method also has several limitations. In particular, each control signal requires its own tap on the delay line. Therefore, systems requiring more control signals than taps on a delay line require multiple delay lines, increasing the system cost and power consumption. Furthermore, generally it is desirable to implement control logic using programmable devices such as PLDs. Like the case with cascaded delay lines, this method requires a large number of I/O connections which requires the use of larger PLDs than necessary. In addition, multi-tap delay lines require that the input pulse's duration be long (i.e., 40% of the total delay time), and the minimum time between input pulses must be four times the pulse duration. This leads to long "dead" times in the control circuit. A further drawback is that multi-tap delay lines, in general, have poor timing accuracy compared with single delay lines.

A string of clock pulses can also be generated using a multivibrator, which is triggered by the start of the event signal. The clock pulses from the multivibrator are fed to a control circuit. This control circuit generates the signals which start and stop the integrator, the measuring period, and the reset cycle, based upon the number of clock pulses received. At the end of the reset cycle, the multivibrator is stopped.

The multivibrator method, however, also has limitations. For example, the control signal can be generated only on the leading edge or trailing edge of the multivibrator clock. Therefore, timing between control signals is a multiple of one half of a clock cycle. For a given total delay, a smaller clock period requires more clock cycles. The accuracy of each clock period is dependent upon the accuracy of the delay line (if used) and the variation in the propagation delay through the clock's logic circuit. Therefore, a larger number of clock cycles will result in larger timing errors. This error can be reduced by using larger delay lines, i.e., a longer period clock. However, for the multivibrator to settle in its steady state, an integer number of full clock cycles is required for the clock system to be cleared and ready for a new start pulse. This results in additional dead time if the required delay is not an integer multiple of a full cycle. For example, a clock using 75 ns-delay line is disabled by the control logic on the clock's falling edge. The clock is at the correct start point, but the delay line requires 75 ns before it is cleared. If the clock is started during that period, the clock will not function correctly.

Accordingly, there is a need for an improved asynchronous clock having reduced error as compared to conventional timing methods and systems.

SUMMARY OF THE INVENTION

The present invention overcomes the drawbacks of these prior art systems through the provision of a cascaded delay asynchronous clock (CDAC) for operating control logic to process an event signal. The clock comprises a flip-flop for receiving the event signal and generating a clock enable signal and a logic gate connected to the flip-flop for receiving the clock enable signal and generating a clock signal. The clock signal is then communicated to the control logic for use in the control process. The CDAC further includes a plurality of cascaded delays connected in series, such that the first of cascaded delay is connected to receive as an input the clock signal, and the last delay is further connected to the logic gate. The output of each of the plurality of delays is fed back to the control logic to generate timing signals.

In another aspect of the present invention, a variable duty cycle asynchronous clock (VDAC) for operating control logic to process an event signal is disclosed. The clock comprises a first flip-flop for receiving the event signal and generating a clock enable signal, decode logic adapted to receive the clock enable signal and generate a control signal, and a second flip-flop adapted to receive the control signal and generate a clock signal. The clock signal is communicated to the control logic for use as a timing signal. The VDAC further includes first and second series connected delays, wherein the output of each of the delays is fed back to the decode logic and control logic to generate timing signals.

The present invention includes the advantages associated with cascaded delay lines and multivibrators without the associated drawbacks. Other objects and advantages of the invention will become apparent upon reading the following detailed description and appended claims and upon reference to the accompanying drawings.

BRIEF DESCRIPTION OF THE DRAWINGS

For a more complete understanding of this invention, references should now be had to the embodiments illustrated in greater detail in the accompanying drawings and described below by way of examples of the invention.

In the drawings:

FIG. 1 is a schematic diagram of a cascaded delay asynchronous clock in accordance with one embodiment of the present invention.

FIGS. 2A–2G are timing diagrams for the CDAC of FIG. 1 having 3 delay lines.

FIG. 3 is a schematic diagram of a variable duty cycle asynchronous clock (VDAC) in accordance with one embodiment of the present invention.

FIGS. 4A–4I are timing diagrams for the VDAC of FIG. 3 having equal delays.

FIGS. 5A–5I are timing diagrams for the VDAC of FIG. 3 wherein the first delay is twice the second.

FIGS. 6A–6I are timing diagrams for the VDAC of FIG. 3 wherein the first delay is half the second.

DETAILED DESCRIPTION OF THE PREFERRED EMBODIMENT

FIG. 1 is a schematic diagram of a Cascaded Delay Asynchronous Clock (CDAC) in accordance with one embodiment of the present invention. The CDAC of FIG. 1 has the advantages of the cascaded delay line method and the multivibrator method without the associated drawbacks. A cascade of n delay lines 10 is used in the feedback loop of the timing circuit. A signal input to a first flip-flop 15 (FF1) generates an enable signal to start the timing circuit. This results when the output signal of the NOR gate 14 goes high. The output of the NOR 14 is transmitted through a set of cascaded delay lines 10 and is fed back into the NOR gate 14. The output of the NOR gate 14 represents the clock signal and the output of each delay line 10 (fb1 through fbn) represents the clock output shifted by a fixed delay.

The clock signal and the feedback signals (fb1 through fbn) are available to the control logic 16 and are used to generate the control signals required to process the asynchronous event. In the implementation shown in FIG. 1, a counter 18 is used along with the control logic 16 to reinitialize the circuit after the completion of the event processing. In this way, the counter 18 generates the reset signal. Note that the counter can also be used in the generation of control signals. Thus, after a first elapsed time the counter can communicate a control signal, after a record elapsed time another control signal can be communicated, and so on.

FIGS. 2A–2G show timing diagrams for a 3-cascaded delay line implementation of the circuit of FIG. 1. In FIGS. 2A–2G, each cascaded delay is equal. Note, however, that the delay lines (fb1, fb2, fb3) need not be equal, and may be selected to provide signals at any required interval within the clock cycle. As shown in FIG. 2A, when the input signal 20 goes high, the enable signal 22 activates the clock signal 24 which is fed into the cascaded delay lines. The output 25, 26, 27 of each delay line (fb1, fb2, fb3) represents the clock signal 24 shifted by, in this case, an equal delay. This continues until the clock signal is reset 28 at time t2.

The CDAC retains advantages from both the cascaded delay method and the multivibrator method. The cascaded delays 10 of the CDAC allow control signals to be generated with a timing resolution of less than one half of a clock cycle, however, the number of individual delay lines required to cover a given total control period is less than that required by the conventional cascaded delay line method. The CDAC also has the advantage of being more accurate than the standard multivibrator, given the same timing resolution for the clock.

For example, consider a case where a 75 ns timing resolution over a total control period of 600 ns is required. A simple multivibrator with a 75 ns-delay line will provide the required signals. However, the overall timing uncertainty after approximately 600 ns is given by the error in the delay line (multiplied by 8 times) plus the variation in the propagation delay of the logic device (again multiplied by 8). For a CDAC implemented with two cascaded delay lines, the uncertainty is equal to the error of the delay lines (the sum of the errors of two delay lines multiplied by 4) plus the variation in the propagation delay of the logic device (multiplied by 4 in this case). By using four delay lines, the uncertainty due to propagation delay error is again reduced in half. Thus, the accuracy of the CDAC is improved over the standard multivibrator. In addition, fewer components are used versus standard cascaded delay lines.

The accuracy of typical digital delay lines plays a significant role in the selection of the preferred components. It has been found that the highest accuracy (as a percentage) can be achieved in devices with a delay of at least 70 ns, but less than 100 ns. Larger delays have approximately 67% wider tolerances (as a percentage) than the delays within the preferred range. The specified tolerances for smaller delays (as percentage) are approximately 33% wider near the optimum range, but this tolerance increases as a percentage as the delay becomes shorter.

There are certain applications where the optimum solution cannot be achieved with cascaded delay lines, a standard multivibrator, or a CDAC as described above; for example, an application which requires a total control period of 675 ns, and control signals at various multiples of 75 ns. To implement this desired period with cascaded delay lines requires 9 delay lines, and an even greater number of I/O connections on a programmable logic device (used for generating control signals). Such a solution may be undesirable due to the complexity and cost of such a system. Likewise, a standard multivibrator or a CDAC using 75 ns delay lines would be undesirable because the total control period is an odd multiple of the delay time. If the clock is used through the full cycle (an additional half cycle), there will be additional dead time which may not be acceptable/desirable. Specifically, a standard multivibrator with a 35 or 40 ns delay line, would have greatly reduced accuracy because the percentage error is larger for the smaller delay lines. Also the propagation uncertainty is doubled, since twice as many cycles are necessary. Again, the additional error generated by such an implementation may not be acceptable or desirable from a system standpoint.

To address the issue of "half cycles" or "odd multiples", a Variable Duty Cycle Asynchronous Clock (VDAC) is shown in FIG. 3. FIG. 3 shows a schematic diagram of one embodiment of a VDAC in accordance with the present invention. The VDAC 30 is enabled in the same manner as the CDAC, with an input signal generating an enable signal at the output of a first flip-flop 32 (FF1). This is communicated to the decode logic 41 comprising NOR gate 31, OR gate 33 and AND gate 35. Since signal A from NOR gate 31, and therefore signal B from OR gate 33, is high in the initialized state, the enable signal triggers the clock output represented by second flip-flop 34 (FF2), which is set up in the toggle mode. A high clock output drives signal A, and therefore signals B and C low. After the duration of the first delay 36, the output of delay 36 (signal fb1) feeds the input of second delay 38 and drives signal B (and therefore C from AND gate 35) high. This toggles the second flip-flop 34 and drives the clock output low. This, in turn, drives signal A high, holding B and C high, which helps prevent signal errors. After the duration of the second delay 38, the output of delay 38 (fb2) goes high, driving signal A low. When signal fb2 goes low (which follows after fb1 goes low), signal A, and therefore signals B and C, are driven high, toggling the second flip-flop 34 and driving the output clock high once again.

The signals clock, fb1, and fb2 are available to the control logic 40 for generating control signals. A counter 42 may also be used in conjunction with these signals, and can be used to determine the proper time to reset/reinitialize the system. Additional signal inputs for generating control signals can be made using cascaded delay lines for delays 36, 38, as described with respect to the CDAC.

FIGS. 4A–4I show timing diagrams for the VDAC of FIG. 3 having equal delay times for delays 36, 38. As shown in FIGS. 4A–4I, with the delay times equal, the duty cycle of the clock signal is approximately one-third.

FIGS. 5A–5I show timing diagrams for the VDAC of FIG. 3 wherein the first delay time is twice as long as the second delay time. Thus, delay 36 is twice as long as delay 38. As can be seen in FIGS. 5A–5I, as the first delay gets longer with respect to the second, the duty cycle of the clock signal approaches one-half.

Finally, FIGS. 6A–6I show timing diagrams for the VDAC of FIG. 3 wherein the second delay time is twice as long as the first delay time. Thus, delay 38 is twice as long as delay 36. As can be seen in FIGS. 6A–6I, as the second delay grows longer with respect to the first delay, the duty cycle of the clock signal approaches zero.

Table 1 illustrates the advantages of the CDAC and VDAC versus a multivibrator. The table shows the uncertainty of the control signals from the clocks and the times when the clocks can be stopped (note that the clocks must be stopped on an integer number of cycles). For the calculations, the CDAC and VDAC each had two equal delay lines. Further, all of the clocks had a 75 ns delay lines and logic circuits with 6.25 ns propagation delays. The delay lines and propagation delays are assumed to have a spread of ±1.25 ns. The leading and falling edges of the clock pulse was used for the control signals from the multivibrator. The leading edge of signal fb1 and the leading and falling edges of signal fb2 were used for the CDAC and VDAC control signals.

TABLE 1

| Multivibrator | | CDAC | | VDAC | |
| --- | --- | --- | --- | --- | --- |
| Timing of the Edge (ns) | Can the Clock Terminate on this Edge (y/n) | Timing of the Edge (ns) | Can the Clock Terminate on this Edge (y/n) | Timing of the Edge (n/s) | Can the Clock Terminate on this Edge (y/n) |
| 81.25 ± 2.50 | N | 81.25 ± 2.50 | N | 81.25 ± 2.50 | N |
| 162.50 ± 5.00 | Y | 156.25 ± 3.75 | N | 156.25 ± 3.75 | N |
| 243.75 ± 7.50 | N | 237.50 ± 6.25 | N | 237.50 ± 6.25 | Y |
| 325.00 ± 10.00 | Y | 312.50 ± 7.50 | Y | 318.75 ± 8.75 | N |
| 406.25 ± 12.50 | N | 393.75 ± 10.00 | N | 393.75 ± 10.00 | N |
| 487.50 ± 15.00 | Y | 468.75 ± 11.25 | N | 475.00 ± 12.50 | Y |
| 568.75 ± 17.50 | N | 550.00 ± 13.75 | N | 556.25 ± 15.00 | N |
| 650.00 ± 20.00 | Y | 625.00 ± 15.00 | Y | 631.25 ± 16.25 | N |
| 731.25 ± 22.50 | N | 706.25 ± 17.50 | N | 712.50 ± 18.75 | Y |
| 812.50 ± 25.00 | Y | 781.26 ± 18.75 | N | 793.75 ± 21.25 | N |
| 893.75 ± 27.50 | N | 862.50 ± 21.25 | N | 868.75 ± 22.50 | N |
| 975.00 ± 30.00 | Y | 937.50 ± 22.50 | Y | 950.00 ± 25.00 | Y |

If the propagation delay through the logic circuits is ignored, the duty cycle for the clock is given by the formula:

$$D = (\text{delay 1})/(2 \cdot \text{delay 1} + \text{delay 2})$$

Thus, with equal delay lines the duty cycle is ⅓. As delay 1 grows large with respect to delay 2, the duty cycle will approach ½. As delay 2 grows large with respect to delay 1, the duty cycle will approach 0. Duty cycles greater than ½ can be gained by using the inverse of the clock pulse. It is important, however, that the delay lines must have a delay greater than the specified propagation delay of the logic device(s).

As can be seen in Table 1, the error for the same number of clock cycles is reduced for the CDAC and VDAC as compared to the multivibrator. The VDAC and CDAC also have a lower total elapsed time resulting in higher time resolution as compared to the multivibrator.

From the foregoing it will be seen that there has been brought to the art a new and improved asynchronous clock which overcomes the drawbacks associated with conventional electronic timing methods. While the invention has been described with one or more embodiments it will be understood that the invention is not limited to those embodiments. On the contrary, the invention covers all alternatives, modification, and equivalents, as may be included within the spirit and scope of the appended claims.

What is claimed is:

1. A cascaded delay circuit for generating asynchronous clock signals for operating control logic (16) to process an event signal, the circuit comprising:

a flip-flop (15) for receiving said event signal and generating a clock enable signal;

a logic gate (14) connected to said flip-flop (15) for receiving said clock enable signal and generating a clock signal, said clock signal being communicated to said control logic (16); and a plurality of cascaded delays (10) connected in series, the first of said plurality of cascaded delays (10) connected to receive as an input said clock signal, the last of said plurality of cascaded delays (10) further connected to said logic gate (14), wherein the output of each of said plurality of cascaded delays (10) is fed back to said control logic (16) to generate timing signals.

2. The cascaded delay circuit of claim 1 further comprising a counter (18) connected between said logic gate (14) and said control logic (16), said counter (18) being adapted to reinitialize the cascaded delay circuit at the completion of the event processing.

3. The cascaded delay circuit of claim 1 wherein said logic gate (14) is a NOR gate.

4. The cascaded delay circuit of claim 1 wherein each of said plurality of cascaded delays (10) have equal delay periods.

5. The cascaded delay circuit of claim 1 wherein at least one of said plurality of cascaded delays (10) has a different delay period than the remaining said plurality of cascaded delays (10).

6. The cascaded delay circuit of claim 1 wherein each of said plurality of cascaded delays (10) has a delay period of between approximately 70 and 100 nanoseconds.

7. A variable duty cycle circuit for generating syncharonous clock signals for operating a control logic (40) to process an event signal, the circuit comprising:

a first flip-flop (32) for receiving said event signal and generating a clock enable signal;

a decode logic unit (41) adapted to receive said clock enable signal and generate a control signal;

a second flip-flop (34) adapted to receive said control signal and generate a clock signal, said clock signal being communicated to said control logic (40); and first and second series connected delays (36, 38), the first of said series connected delays (36, 38) connected to receive as an input said clock signal; the output of each of said series connected delays being fed back to said decode logic unit (41) and to said control logic (40) to generate a timing signal.

8. The variable duty cycle circuit of claim 7 further comprising a counter (42) connected between said second flip-flop (34) and said control logic (40), said counter (42) being adapted to reinitialize the variable duty cycle circuit at the completion of the event processing.

9. The variable duty circuit clock of claim 7 wherein said decode logic unit (41) comprises a NOR gate (31), an OR gate (33), and an AND gate (35), respectively, the outputs of said first delay (36) and said NOR gate (31) being connected to the input of said OR gate (33) and the outputs of said second delay (38) and said second flip-flop (34) being connected to the input of said NOR gate (31), and the outputs of said OR gate (33) and said first flip-flop (32) being connected to said AND gate (35), and the output of said AND gate (35) connected to said second flip-flop (34) to generate said clock signal.

10. The variable duty cycle circuit of claim 7 wherein said first and second delays (36, 38) have equal delay periods.

11. The variable duty circuit clock of claim 7 wherein said first delay (36) has a longer delay period than said second delay (38).

12. The variable duty cycle circuit of claim 7 wherein said second delay (38) has a longer delay period than said first delay (36).

13. The variable duty circuit clock of claim 7 wherein said first and second delays (36, 38) have delay periods of between approximately 70 and 100 nanoseconds.

14. The variable duty circuit clock of claim 11 wherein said first and second delays (36, 38) have delay periods of between approximately 70 and 100 nanoseconds.

15. The variable duty circuit clock of claim 12 wherein said first and second delays (36, 38) have delay periods of between approximately 70 and 100 nanoseconds.

16. A variable duty cycle circuit for generating asynchronous clock signals for operating a control logic to process an event signal, the circuit comprising:

a first flip-flop for receiving said event signal and generating a clock enable signal;

a decode logic unit adapted to receive said clock enable signal and generate a control signal;

a second flip-flop adapted to receive said control signal and generate a clock signal, said clock signal being communicated to said control logic; and a plurality of cascaded delays, the first of said plurality of cascaded delays connected to receive as an input said clock signal, the output of each of said plurality of cascaded delays being fed back to said decode logic unit and to said control logic to generate timing signals.

17. The variable duty cycle circuit of claim 16 further comprising a counter connected between said second flip-flop and said control logic, said counter being adapted to reinitialize the variable duty cycle circuit at the completion of the event processing.

18. The variable duty circuit clock of claim 16 wherein each of said plurality of cascaded delays have equal delay periods.

19. The variable duty cycle circuit of claim 16 wherein at least one of said plurality of cascaded delays has a different delay period than the remaining said plurality of cascaded delays.

20. The variable duty cycle circuit of claim 16 wherein each of said plurality of cascaded delays has a delay period of between approximately 70 and 100 nanoseconds.

* * * * *